(12) United States Patent
Chen et al.

(10) Patent No.: US 12,136,599 B2
(45) Date of Patent: Nov. 5, 2024

(54) THREE-DIMENSIONAL MEMORY DEVICES AND FABRICATING METHODS THEREOF

(71) Applicant: Yangtze Memory Technologies Co., Ltd., Hubei (CN)

(72) Inventors: He Chen, Hubei (CN); Shu Wu, Hubei (CN); Zhen Pan, Hubei (CN); Siping Hu, Hubei (CN); Yi Zhao, Hubei (CN); Ziqun Hua, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 255 days.

(21) Appl. No.: 17/591,429

(22) Filed: Feb. 2, 2022

(65) Prior Publication Data

US 2022/0246544 A1    Aug. 4, 2022

(30) Foreign Application Priority Data

Feb. 2, 2021    (CN) .......................... 202110142144.0

(51) Int. Cl.
*H01L 29/788* (2006.01)
*H01L 23/00* (2006.01)
(Continued)

(52) U.S. Cl.
CPC .......... *H01L 23/562* (2013.01); *H01L 23/535* (2013.01); *H01L 23/564* (2013.01);
(Continued)

(58) Field of Classification Search
CPC ................ H01L 23/562; H01L 23/535; H01L 23/564; H01L 23/585; H01L 24/08; H01L 24/80; H01L 25/0657; H01L 25/18; H01L 25/50; H01L 2224/08145; H01L 2224/80895; H01L 2224/80896; H01L 2924/1431; H01L 2924/1434; H01L 2924/351; H01L 23/481; H01L 29/792; H01L 27/14634; H01L 27/1469; H01L 23/528; H01L 2224/16145;
(Continued)

(56) References Cited

U.S. PATENT DOCUMENTS

| 8,076,756 | B2 | 12/2011 | Lane et al. |
| 9,876,031 | B1* | 1/2018 | Shimizu ................ H10B 43/27 |
| 11,348,936 | B2 | 5/2022 | Chen et al. |
| 2006/0278957 | A1 | 12/2006 | Lin et al. |

(Continued)

FOREIGN PATENT DOCUMENTS

| CN | 101681890 A | 3/2010 |
| CN | 109037157 A | 12/2018 |
| CN | 110692138 A | 1/2020 |

(Continued)

*Primary Examiner* — Niki H Nguyen
(74) *Attorney, Agent, or Firm* — Conley Rose, P.C.

(57) ABSTRACT

Disclosed are three-dimensional (3D) memory devices and fabricating methods thereof. In some embodiments, a disclosed memory device comprises a wafer structure having a sealing region and a chip region. The wafer structure comprises a substrate, a memory string array on a first side of the substrate in the chip region, a first protection structure and a second protection structure on the first side of the substrate in the sealing region, and a first contact and a second contact extending through the substrate in the sealing region. The first contact is in contact with the first protection structure, and the second contact is in contact with the second protection structure.

18 Claims, 14 Drawing Sheets

(51) Int. Cl.
  *H01L 23/535* (2006.01)
  *H01L 23/58* (2006.01)
  *H01L 25/00* (2006.01)
  *H01L 25/065* (2023.01)
  *H01L 25/18* (2023.01)

(52) U.S. Cl.
  CPC ............ *H01L 23/585* (2013.01); *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/1434* (2013.01); *H01L 2924/351* (2013.01)

(58) Field of Classification Search
  CPC ............. H01L 21/823475; H01L 24/06; H01L 2224/8034; H01L 2224/48145
  See application file for complete search history.

(56) References Cited

U.S. PATENT DOCUMENTS

| | | | |
|---|---|---|---|
| 2016/0211227 A1 | 7/2016 | Wagner et al. | |
| 2020/0328186 A1* | 10/2020 | Liu | ................ H01L 25/50 |
| 2021/0296299 A1* | 9/2021 | Shibata | ................ H01L 24/05 |

FOREIGN PATENT DOCUMENTS

| | | | | |
|---|---|---|---|---|
| CN | 111081647 A | | 4/2020 | |
| CN | 111566815 B | * | 9/2021 | ....... H01L 21/76802 |

* cited by examiner

THREE-DIMENSIONAL MEMORY DEVICES AND FABRICATING METHODS THEREOF

CROSS-REFERENCE TO RELATED APPLICATIONS

This application claims priority to Chinese Patent Application No. 202110142144.0, filed on Feb. 2, 2021, which is incorporated herein by references in its entirety.

TECHNICAL FIELD

The present disclosure generally relates to the field of semiconductor technology, and more particularly, to three-dimensional (3D) memory devices and fabricating methods thereof.

BACKGROUND

Computer memory is a sequential logic circuit, and Random Access Memory (RAM) is one type of computer memory. With the development of the semiconductor manufacturing process, the storage density of computer memory is continuously increasing and the size of computer memory is continuously decreasing. Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit. A 3D memory architecture can address the density limitation in planar memory cells. The 3D memory architecture includes a memory array and peripheral devices for controlling signals to and from the memory array.

BRIEF SUMMARY

Embodiments of 3D memory devices and fabrication methods thereof are disclosed herein.

In some embodiments, a disclosed memory device comprises a first wafer structure having a sealing region and a chip region. The first wafer structure comprises a substrate, a memory string array on a first side of the substrate in the chip region, a first protection structure and a second protection structure on the first side of the substrate in the sealing region, and a first contact and a second contact extending through the substrate in the sealing region. The first contact is in contact with the first protection structure, and the second contact is in contact with the second protection structure.

In some embodiments, the memory device further comprises an insulating structure extending through the substrate in the sealing region.

In some embodiments, the second contact is located on one side of the first contact and the insulating structure is located on another side of the first contact.

In some embodiments, the memory device further comprises a plurality of second contacts and a plurality of first contacts arranged in staggered positions from each other.

In some embodiments, the memory device further comprises an insulating layer on a second side of the substrate.

In some embodiments, the substrate comprising a semiconductor material, and the insulating layer comprising an oxide material.

In some embodiments, the first contact and the second contact penetrate the substrate and the insulating layer.

In some embodiments, the memory device further comprises a conductive layer disposed on the insulating layer.

In some embodiments, the first contact and the second contact are electrically connected to the conductive layer.

In some embodiments, the first wafer structure further comprises a first bonding layer disposed on the memory string array, the first protection structure, and the second protection structure. The memory device further comprises a second wafer structure including a second bonding layer disposed on a periphery circuit layer. The first bonding layer of the first wafer structure is bonded with the second bonding layer of the second wafer structure.

Another aspect of the present disclosure provides a method for forming a memory device, comprising: forming a substrate; forming a memory string array on a first side of the substrate in a chip region; forming a first protection structure and a second protection structure on the first side of the substrate in a sealing region; forming an insulating layer on a second side of the substrate; and forming a first contact and a second contact extending through the substrate in the sealing region; wherein the first contact is in contact with the first protection structure, and the second contact is in contact with the second protection structure.

In some embodiments, forming the first protection structure and the second protection structure comprises: forming the first protection structure to enclose the memory string array in a horizontal direction; and forming the second protection structure to enclose the memory string array in the horizontal direction.

In some embodiments, forming the first contact and the second contact comprises: forming a patterned mask layer on the insulating layer; removing portions of the insulating layer and the substrate in the sealing region to form the a first contact opening and a second contact opening in the insulating layer and the substrate; and forming the first contact in the first contact opening, and forming the second contact in the second contact opening.

In some embodiments, the method further comprises forming an insulating structure extending through the substrate in the sealing region.

In some embodiments, the substrate is formed by a semiconductor material, and the insulating layer is formed by an oxide material.

In some embodiments, the second contact is formed on one side of the first contact and the insulating structure is formed on another side of the first contact.

In some embodiments, forming the first contact and the second contact comprises: forming a plurality of first contacts; and forming a plurality of second contacts; wherein the plurality of second contacts and the plurality of second contacts are arranged in staggered positions from each other.

In some embodiments, the method further comprises forming a conductive layer on the insulating layer.

In some embodiments, the conductive layer is formed electrically connected to the first contact and the second contact.

In some embodiments, the method further comprises forming a first bonding layer on the memory string array, the first protection structure, and the second protection structure; and bonding a wafer structure to the first bonding layer.

In some embodiments, the wafer structure comprises an second bonding layer disposed on a periphery circuit layer.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
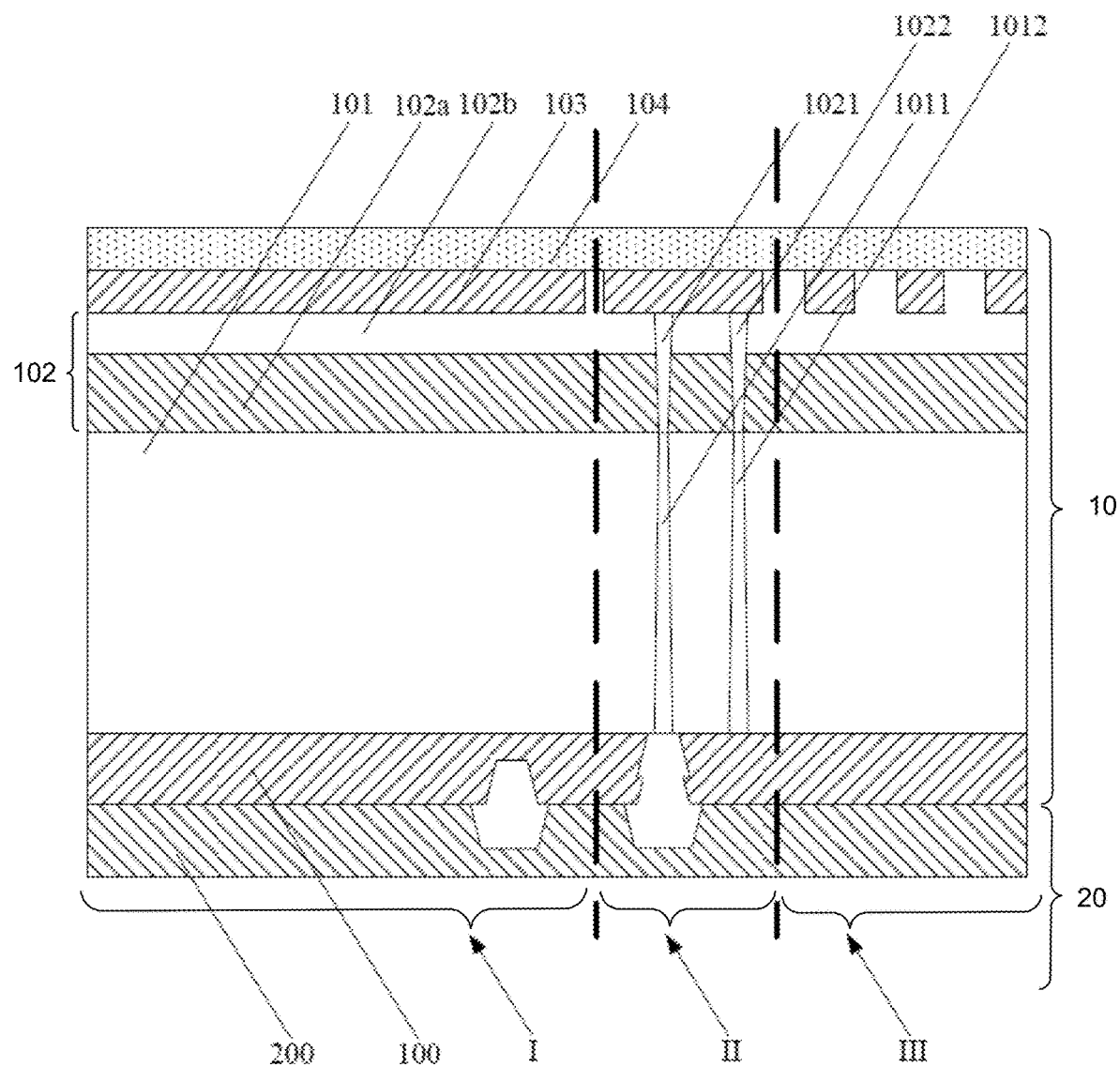
FIG. 1A illustrates a schematic diagram of an exemplary 3D memory device in a cross-sectional view, in accordance with some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

The manufacturing process of a 3D memory generally includes forming various film layers with predetermined patterns on a wafer, and scribing the wafer to form multiple memory chips. Laser scribing is one type of wafer scribing method. Specifically, when a laser beam irradiates a wafer, the carbon material in the film structures on the wafer undergoes thermal expansion due to the laser heating, thereby generating stress caused by the thermal expansion phenomenon within the wafer. Usually, most of the stress can be absorbed by the material layers in the scribing edge areas. However, a small part of the stress may still be transmitted to other areas, such as the chip areas, resulting in undesirable increasing of product defect rate. Mechanical scribing, as an another type of wafer scribing method, has the same issue described above.

Figure 1B:
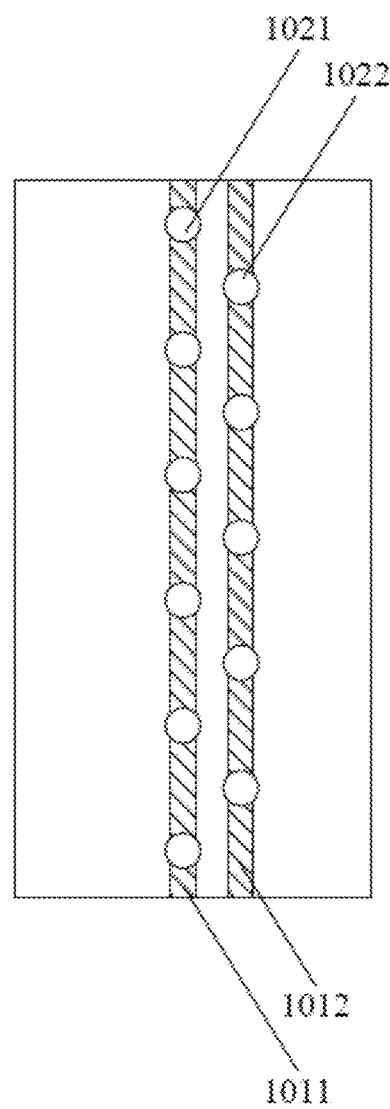
FIG. 1B illustrates a schematic diagram of an exemplary sealing region of the 3D memory device of FIG. 1A in a plan view, in accordance with some embodiments of the present disclosure.
Figure 1C:
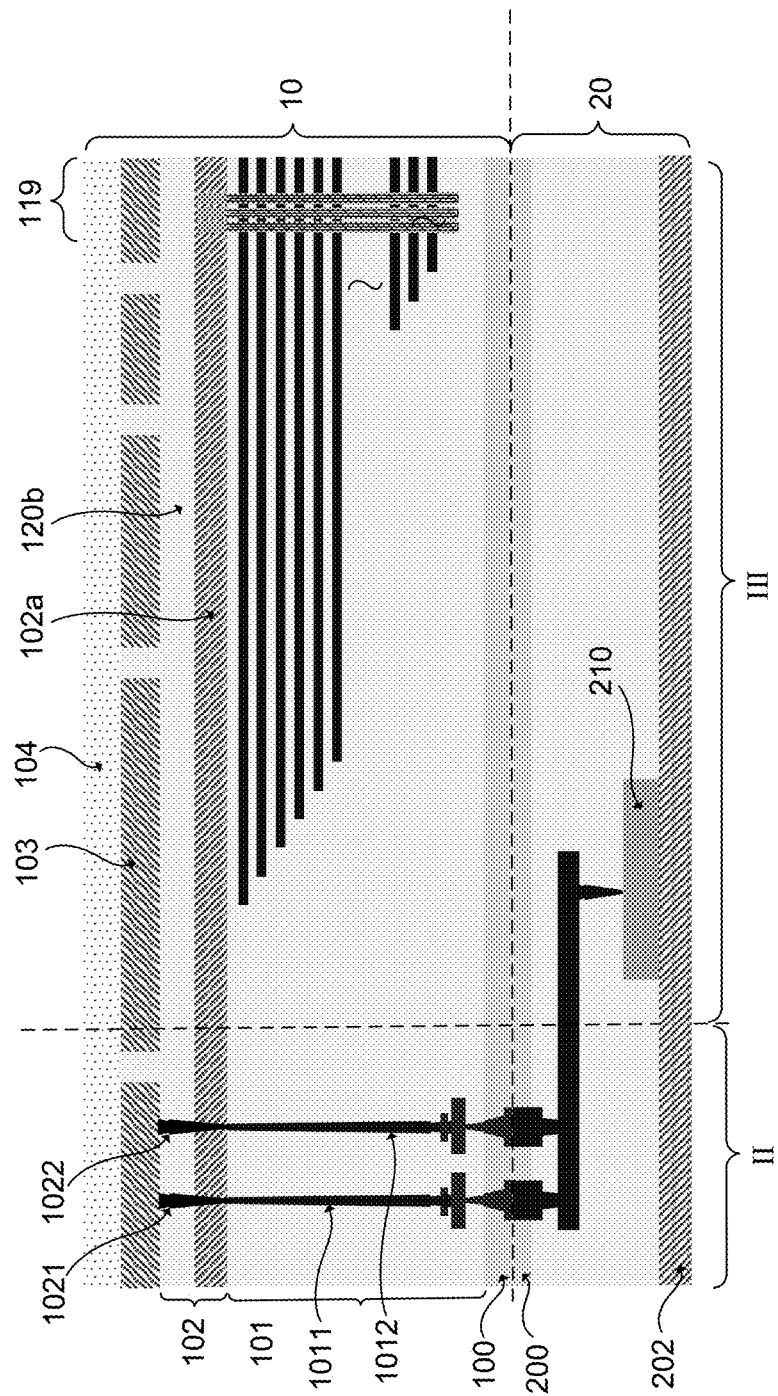
FIG. 1C illustrates a schematic diagram of exemplary sealing region and chip region of 3D memory device in a cross-sectional view, in accordance with some embodiments of the present disclosure.

FIG. 1A illustrates a schematic diagram of an exemplary 3D memory device in a cross-sectional view, in accordance with some embodiments of the present disclosure. FIG. 1B illustrates a schematic diagram of an exemplary sealing region of the 3D memory device of FIG. 1A in a plan view, in accordance with some embodiments of the present disclosure. FIG. 1C illustrates a schematic diagram of exemplary sealing region and core region of the 3D memory device of FIG. 1A in a cross-sectional view, in accordance with some embodiments of the present disclosure.

As shown in FIG. 1A and FIG. 1B, in some embodiments of the present disclosure, the 3D memory device can include a first wafer structure 10 (also referred as a memory array wafer) and a second wafer structure 20 (also referred as a peripheral circuit wafer).

The first wafer structure 10 can include a first bonding layer 100 having an inner side surface and an outer side surface. It is understood that one or more interconnect layer can be arranged between the first bonding layer 100 and a lower functional layer 101, as shown in FIG. 1C. It is also understood that the lower functional layer 101 can include a memory string array 119 of the first wafer structure 10, as shown in FIG. 1C. A second bonding layer 200 of the second wafer structure 20 can be bonded to the first bonding layer 100 of the first wafer structure 10. It is understood that one or more peripheral circuits 210 of the second wafer structure 20 can be formed in the second wafer structure 20 and located a distal side of the second bonding layer 200 that is away from the first wafer structure 10, as shown in FIG. 1C.

The first wafer structure 10 can include a scribing region I, a sealing region II, and a chip region III. The chip region III can include at least one memory string array 119, as shown in FIG. 1C. The sealing region II can surround the chip region III in a horizontal plane and provide a sealing function to protect the chip region III. The scribing region I can surround the sealing region II in a horizontal plane and can be removed after the formation of the memory device by using any suitable scribing method, such as laser scribing, mechanical scribing, etc. As shown in FIG. 1A, the sealing region II can be located in between of the scribing region I and the chip region III.

The first bonding layer 100 can include a dielectric layer and multiple bonding pads embedded in the dielectric layer.

A lower functional layer 101 can be disposed on a distal side of the first bonding layer 100 that is away from the second wafer structure 20. The lower functional layer 101 can include different structures in the scribing region I, the sealing region II, and the chip region III. In the scribing region I and the sealing region II, the lower functional layer 101 can be an insulating layer including any suitable oxide material, such as silicon oxide. In the sealing region II, as shown in FIGS. 1A and 1C, the lower functional layer 101 can include a first protection structure 1011 and a second protection structure 1012 both penetrating the insulating layer. In some embodiments, both the first protection structure 1011 and the second protection structure 1012 can be contact walls. In the chip region III, as shown in FIG. 1C, the lower functional layer 101 can include at least one memory string array, such as multiple memory strings penetrating a dielectric/conductive stack.

Figure 2A:
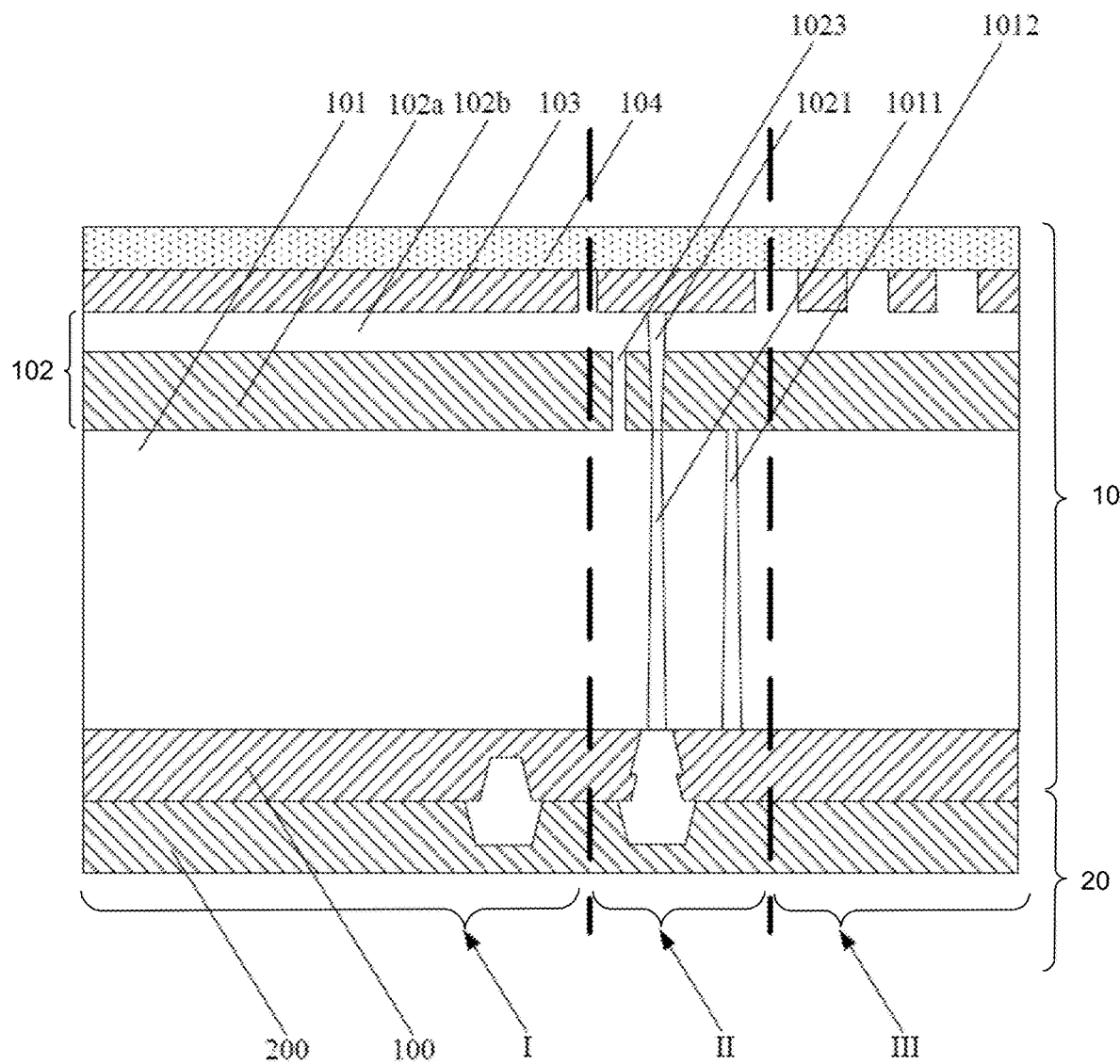
FIG. 2A illustrates a schematic diagram of another exemplary 3D memory device in a cross-sectional view, in accordance with some embodiments of the present disclosure.

A middle functional layer 102 can have a single-layer structure (not shown) or a multi-layer structure (as shown in FIGS. 1A-1C) and can be disposed on one side of the lower functional layer 101 that is away from the first bonding layer 100. The middle functional layer 102 can include at least one first contact 1021 and at least one buffer component (e.g., second contact 1022 as shown in FIG. 1A, or insulating structure 1023 as shown in FIG. 2A) in the sealing region II. The buffer component can be embedded in at least a part of the middle functional layer 102. The material of the at least one embedded buffer component can be different from the material of the middle functional layer 102.

In some embodiments, the middle functional layer 102 can have a double-layer structure or a multi-layer structure. In the following description in connection with FIGS. 1A-1C, a double-layer middle functional layer is described as an example. For example, the middle functional layer 102 can include a first middle functional sub-layer 102a and a second middle functional sub-layer 102b.

The first middle functional sub-layer 102a can be a substrate (also referred as a "first substrate") including any suitable material such as Group III-V compounds including, but not limited to, monocrystalline silicon (mono Si), polycrystalline silicon (poly Si), monocrystalline germanium (Ge), silicon germanium (GeSi), silicon carbide (SiC), silicon on insulator (SOI), germanium on insulator (GOI), gallium arsenide, etc. In one example, the material of the first middle functional sub-layer 102a can include silicon. The material of the second middle functional sub-layer 102b can be an insulating layer. The material of the second middle functional sub-layer 102b can include oxide, such as silicon oxide.

In some other embodiments now shown in FIGS. 1A and 2A, the middle functional layer 102 can be a single-layer substrate without an insulating support layer. For example, the middle functional layer 102 can be a poly Si layer.

In some embodiments, the buffer component can include at least one second contact and/or at least one insulating structure. In some embodiments, the buffer component can be at least one second contact 1022 as shown in FIG. 1A, or at least one insulating structure 1023 as shown in FIG. 2A.

As shown in FIG. 1A, the at least one first contact 1021 and the at least one second contact 1022 can penetrate a multi-layer structure. For example, the at least one first contact 1021 and the at least one second contact 1022 can penetrate the first middle functional sub-layer 102a and the second middle functional sub-layer 102b. The at least one first contact 1021 and the at least one second contact 1022 can electrically contact with the first protection structure 1011 and the second protection structure 1012 respectively to generate an anti-static function to protect the chip region III of the first wafer structure 10.

As shown in FIG. 2A, the at least one insulating structure 1023 can penetrate the first middle functional sub-layer 102*a* only. In some embodiments not shown in the drawings, the buffer component can include both the at least one second contact 1022 and the at least one insulating structure 1023.

The second wafer structure 20 can include one or more peripheral circuits arranged on a distal side of the second bonding layer 200 that is away from the first wafer structure 10. The second bonding layer 200 can include a dielectric layer and multiple bonding pads embedded in the dielectric layer.

The first wafer structure 10 and the second wafer structure 20 can be bonded together by joining the first bonding layer 100 and the second bonding layer 200. The first wafer structure 10 and the second wafer structure 20 be electrically connected with each other through one or more interconnect accesses of the bonding pads.

According to some embodiments of the present disclosure, at least one first contact and at least one buffer component (such as at least one second contact) can be formed on the middle functional layer 102 of the first wafer structure 10. Therefore, most of the stress generated during the scribing process in the scribing region I can be first absorbed by a first seal ring comprising the first protection structure and the at least one first contact in the sealing region II, and the unabsorbed small portion of the stress can pass through the gaps between the first contacts to the chip region and be absorbed by a second seal ring comprising the second protection structure and the least one buffer component. Further, the two layers of seal ring structure can provide direct or indirect beneficial effects (e.g., anti-static, water-proof, etc.) to protect the memory cells in the chip region III.

The two-stage stress absorption process can effectively reduce the defects in the chip region caused by the stress generated during the scribing process, thereby improving the production yield of the 3D memory device.

It is noted that, in the exemplary embodiments described above, the target scribing object is a bonding structure of two wafer structures. In some other embodiments, the similar design for the two-stage stress absorption can also be used in a single wafer structure. For example, in some embodiments not shown in the figures, the periphery circuits can be arranged in the chip region III of the first wafer structure 10. In such case, the second wafer structure 20 is no longer needed. The disclosed two layers of protection structures can still provide two-stage stress absorption process and other direct or indirect beneficial effects (e.g., anti-static, water-proof, etc.) to protect the periphery circuit and memory cells in the chip region III.

It is also noted that, in the exemplary embodiments described above, the at least one second contact 1022 is located on one side (e.g., inner side) of the at least one first contact 1021 that is close to the chip region III. In some other embodiments, the at least one second contact 1022 can also be located on another side (e.g., outer side) of the at least one first contact 1021 that is away from the chip region III. In such case, the second protection structure 1012 is also located on the other side (e.g., outer side) of the first protection structure that is away from the chip region III, and in contact with the at least one second contact 1022. That is, the second seal ring can be located in either inner side or outer side of the first seal ring.

In some alternative embodiments, two sets of second contacts 1022 and two corresponding second protection structures 1012 can be provided. The two sets of second contacts 1022 can be located on both sides of the via contact 1021 respectively. That is, one set of second contacts 1022 can be located on one side (e.g., inner side) of the via contact 1021 that is close to the chip region III, and another set of second contacts 1022 can be located on another side (e.g., outer side) of the via contact 1021 that is away from the chip region III. Correspondingly, one second protection structure 1012 can be located on one side (e.g., inner side) of the first protection structure 1011 that is close to the chip region III, and another second protection structure 1012 can be located on another side (e.g., outer side) of the first protection structure 1011 that is away from the chip region III. Therefore, two second seal rings can be arranged on both inner side and outer side of the first seal ring.

According to some embodiments of the present disclosure, the at least one second contact 1022 is located on one side of the at least one first contact 1021 that is away from the chip region III. The stress generated during the scribing operation is first absorbed by the second seal ring comprising the second protection structure and the at least one second contact in the sealing region. The unabsorbed stress is transferred to the chip area III through the gap between the second contacts, and is absorbed by the first seal ring comprising the first protection structure and the at least one first contact. As such, a two-stage stress absorption process can be achieved.

According to some embodiments of the present disclosure, one set of second contacts 1022 can be located on one side (e.g., inner side) of the at least one first contact 1021 that is close to the chip region III, and another set of second contacts 1022 can be located on another side (e.g., outer side) of the at least one first contact 1021 that is away from the chip region III. The stress generated during the scribing operation is first absorbed by one second seal ring comprising one second protection structure and second contacts on the outer side and in the sealing region. One portion of the unabsorbed stress transferred through the gap between the second contacts to the chip area III can be absorbed by the first seal ring comprising the first protection structure and the first contacts. The remaining portion of the unabsorbed stress transferred through the gap between the first contacts to the chip area III can be absorbed by another second seal ring on the inner side and in the sealing region. As such, a three-stage stress absorption process can be achieved to further reduce the defects in the chip region caused by the stress generated during the scribing process, thereby further improving the production yield of the 3D memory device.

It is also noted that, in some embodiments not shown in the figures, three or more seal rings each including a protection structure embedded in the lower functional layer 101 and at least one corresponding contact embedded in the middle functional layer 102 can be arranged to provide for additional enhanced protection to the chip region III. Based on the number of the layers of seal rings, a multiple-stage stress absorption process can be realized.

In some embodiments, the one or more first contacts 1021 and the one or more second contacts 1022 can be arranged on staggered positions from each other. As such, some portions of the unabsorbed stress transferred through the gap between the first contacts to the chip region can be absorbed by the second contacts, and some portions of the unabsorbed stress transferred through the gap between the second contacts to the chip region can be absorbed by the first contacts.

In some embodiments, each second contact may be located on the perpendicular bisector line of two adjacent first contacts. Since the largest component of the stress transferred between adjacent first contacts to the chip region is distributed along the perpendicular bisector line of two adjacent first contacts, it can be the best position to arrange the second contact for absorbing the unabsorbed stress.

In some embodiments, in order to control the production cost, the one or more second contacts 1022 and the one or more first contacts 1021 can be made of a same material, and can be formed at a same fabricating process In some embodiments, the lower functional layer 101 can include a first protection structure 1011 in the sealing region II. The first protection structure 1011 can be aligned with and in contact with a plurality of first contacts 1021, as shown in FIG. 1B.

In some embodiments, the lower functional layer 101 can include a second protection structure 1012 in the sealing region II. The second protection structure 1012 can be aligned with and in contact with a plurality of second contacts 1022, as shown in FIG. 1B.

As shown in FIGS. 1A and 1C, in some embodiments, the upper functional layer 103 can be disposed on one side of the middle functional layer 102 that is away from the first wafer. A material of the upper functional layer 103 can include metal, such as aluminum.

As shown in FIGS. 1A and 1C, the upper functional layer 103 can have different patterns in the scribing region I, the sealing region II, and the chip region III. In the scribing region I and the sealing region II, the upper functional layer 103 may not be patterned. In the chip region III, the upper functional layer 103 can have a predetermined pattern. Further, the upper functional layer 103 can include multiple segments that are located in the scribing region I, the sealing region II, and the chip region III respectively, and are isolated from each other.

As shown in FIGS. 1A and 1C, in some embodiments, an outer protective film 104 can be disposed on the upper functional layer 103. A material of the outer protective film can include nitride, such as silicon nitride.

Figure 2B:
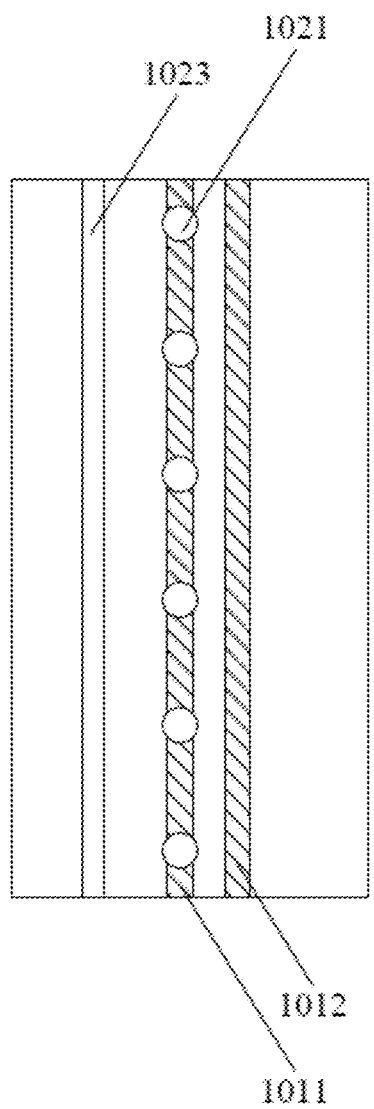
FIG. 2B illustrates a schematic diagram of another exemplary sealing region of the 3D memory device of FIG. 2A in a plan view, in accordance with some embodiments of the present disclosure.
Figure 2C:
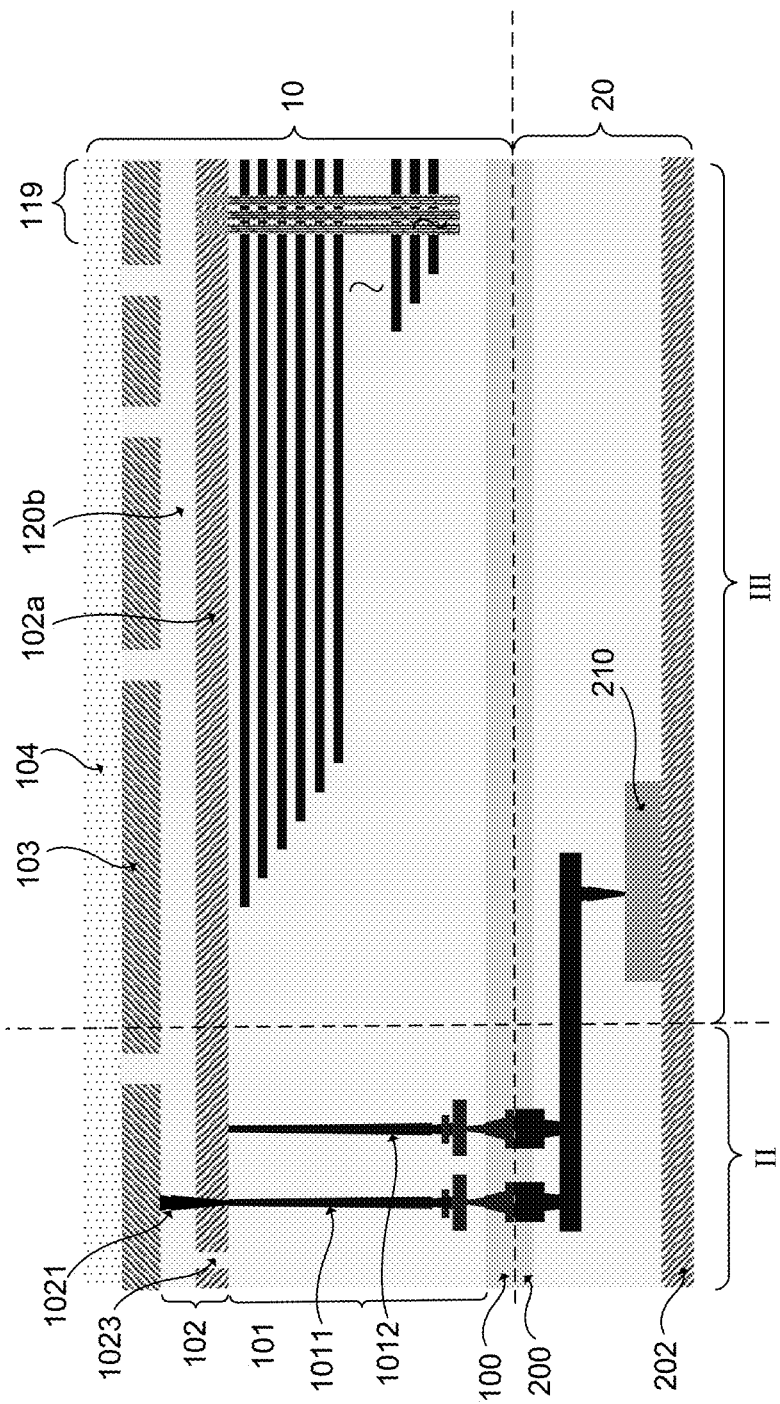
FIG. 2C illustrates a schematic diagram of exemplary sealing region and chip region of 3D memory device in a cross-sectional view, in accordance with some embodiments of the present disclosure.

FIG. 2A illustrates a schematic diagram of another exemplary 3D NAND memory device in a cross-sectional view, in accordance with some embodiments of the present disclosure. FIG. 2B illustrates a schematic diagram of another exemplary sealing region of the 3D NAND memory device of FIG. 2A in a plan view. FIG. 2C illustrates a schematic diagram of exemplary sealing region and core region of the 3D memory device of FIG. 2A in a cross-sectional view, in accordance with some embodiments of the present disclosure.

As shown in FIG. 2A and FIG. 2B, in some embodiments of the present disclosure, the 3D memory device can include a first wafer structure 10 (also referred as a memory array wafer) and a second wafer structure 20 (also referred as a peripheral circuit wafer).

The first wafer structure 10 can include a first bonding layer 100 having an inner side surface and an outer side surface. It is understood that one or more interconnect layer can be arranged between the first bonding layer 100 and a lower functional layer 101, as shown in FIG. 2C. It is also understood that the lower functional layer 101 can include a memory string array 119 of the first wafer structure 10, as shown in FIG. 2C. A second bonding layer 200 of the second wafer structure 20 can be bonded to the first bonding layer 100 of the first wafer structure 10. It is understood that one or more peripheral circuits 210 of the second wafer structure 20 can be formed in the second wafer structure 20 and located a distal side of the second bonding layer 200 that is away from the first wafer structure 10, as shown in FIG. 2C.

The first wafer structure 10 can include a scribing region I, a sealing region II, and a chip region III. The chip region III can include at least one memory string array 119, as shown in FIG. 2C. The sealing region II can surround the chip region III in a horizontal plane and provide a sealing function to protect the chip region III. The scribing region I can surround the sealing region II in a horizontal plane and can be removed after the formation of the memory device by using any suitable scribing method, such as laser scribing, mechanical scribing, etc. As shown in FIG. 2A, the sealing region II can be located in between of the scribing region I and the chip region III.

The first bonding layer 100 can include a dielectric layer and multiple bonding pads embedded in the dielectric layer.

A lower functional layer 101 can be disposed on a distal side of the first bonding layer 100 that is away from the second wafer structure 20. The lower functional layer 101 can include different structures in the scribing region I, the sealing region II, and the chip region III. In the scribing region I and the sealing region II, the lower functional layer 101 can be an insulating layer including any suitable oxide material, such as silicon oxide. In the sealing region II, as shown in FIGS. 2A and 2C, the lower functional layer 101 can include a first protection structure 1011 and a second protection structure 1012 both penetrating the insulating layer. In some embodiments, both the first protection structure 1011 and the second protection structure 1012 can be contact walls. In the chip region III, as shown in FIG. 2C, the lower functional layer 101 can include at least one memory string array, such as multiple memory strings penetrating a dielectric/conductive stack.

In some embodiments, the middle functional layer 102 can have a single-layer structure (not shown) or a double-layer structure or a multi-layer structure. In the following description in connection with FIGS. 2A-2C, a double-layer middle functional layer is described as an example. For example, the middle functional 102 layer can include a first middle functional sub-layer 102a and a second middle functional sub-layer 102b.

The first middle functional sub-layer 102a can be a substrate including any suitable material such as Group III-V compounds including, but not limited to, monocrystalline silicon (Si), monocrystalline germanium (Ge), silicon germanium (GeSi), silicon carbide (SiC), silicon on insulator (SOI), germanium on insulator (GOI), gallium arsenide, etc. In one example, the material of the first middle functional sub-layer 102a can include silicon. The material of the second middle functional sub-layer 102b can be an insulating layer. The material of the second middle functional sub-layer 102b can include oxide, such as silicon oxide. In some embodiments, the buffer component can include at least one second contact and at least one insulating structure.

As shown in FIGS. 2A and 2B, in some embodiments, the buffer component can be at least one insulating structure 1023. Specifically, the at least one first contact 1021 can penetrate a multi-layer structure. For example, the at least one first contact 1021 can penetrate the first middle functional sub-layer 102a and the second middle functional sub-layer 102b. The at least one insulating structure 1023 can penetrate at least one layer of the multi-layer structure that is adjacent to the lower functional layer 101. For example, the at least one insulating structure 1023 can penetrate the first sub-middle functional layer 102a. In some embodiments not shown in the drawings, the buffer component can include both the at least one second contact 1022 and the at least one insulating structure 1023.

The second wafer structure 20 can include one or more peripheral circuits arranged on a distal side of the second bonding layer 200 that is away from the first wafer structure 10. The second bonding layer 200 can include a dielectric layer and multiple bonding pads embedded in the dielectric layer.

The first wafer structure 10 and the second wafer structure 20 can be bonded together by joining the first bonding layer 100 and the second bonding layer 200. The first wafer structure 10 and the second wafer structure 20 be electrically connected with each other through one or more interconnect accesses of the bonding pads.

According to some embodiments of the present disclosure, at least one first contact and at least one buffer component (such as the at least one insulating structure) can be formed on the middle functional layer 102 of the first wafer structure 10. Therefore, most of the stress generated during the scribing process in the scribing region I can be first absorbed by sealing first seal ring comprising the first protection structure and the at least one first contact in the sealing region II, and the unabsorbed small portion of the stress can pass through the gaps between the first contacts to the chip region and be absorbed by the buffer component. The two-stage stress absorption process can effectively reduce the defects in the chip region caused by the stress generated during the scribing process, thereby improving the production yield of the 3D memory device.

It is noted that, in the exemplary embodiments described above, the target scribing object is a bonding structure of two wafer structures. In some other embodiments, the similar design for the two-stage stress absorption can also be used in a single wafer structure. For example, in some embodiments not shown in the figures, the periphery circuits can be arranged in the chip region III of the first wafer structure 10. In such case, the second wafer structure 20 is no longer needed. The disclosed two layers of protection structures can still provide two-stage stress absorption process and other direct or indirect beneficial effects (e.g., anti-static, waterproof, etc.) to protect the periphery circuit and memory cells in the chip region III.

It is also noted that, in the exemplary embodiments described above, the at least one insulating structure 1023 is located on one side (e.g., outer side) of the at least one first contact 1021 that is away from the chip region III. In some other embodiments, the at least one insulating structure 1023 structure can also be located on another side (e.g., inner side) of the at least one first contact 1021 that is close to the chip region III. In some alternative embodiments, two insulating grooves 1023 can be provided. The two insulating structures 1023 can be located on both sides of the first contact 1021 respectively. That is, one insulating structure 1023 can be located on one side (e.g., inner side) of the first contact 1021 that is close to the chip region III, and another insulating structure 1023 can be located on another side (e.g., outer side) of the first contact 1021 that is away from the chip region III.

In some embodiments, in order to control the production cost, the one or more insulating structures 1023 can be formed during a fabricating process of forming the one or more first contacts 1021.

In some embodiments, the upper functional layer 103 can be disposed on one side of the middle functional layer 102 that is away from the first bonding layer 100. A material of the upper functional layer 103 can include metal, such as aluminum.

The upper functional layer 103 can have different patterns in the scribing region I, the sealing region II, and the chip region III. In the scribing region I and the sealing region II, the upper functional layer 103 may not be patterned. In the chip region III, the upper functional layer 103 can have a predetermined pattern. Further, the upper functional layer 103 can include multiple segments that are located in the scribing region I, the sealing region II, and the chip region III respectively, and are isolated from each other.

In some embodiments, an outer protective film can be disposed on the upper functional layer 103. A material of the outer protective film can include nitride, such as silicon nitride.

It is noted that, the embodiments described above in connection with FIGS. 1A-1C and FIGS. 2A-2C disclose using at least one second contact as the buffer component and using at least one insulating structure as the buffer component respectively. In some other embodiments, the buffer components can include both of at least one second contact and at least one insulating structure. In one specific example, one buffer component can include at least one second contact located on the inner side of the at least one first contact, and another buffer component can include at least one insulating structure located on the outer side of the at least one first contact. In another specific example, one buffer component can include at least one insulating structure located on the inner side of the at least one first contact, and another buffer component can include at least one second contact located on the outer side of the at least one first contact.

Figure 3:
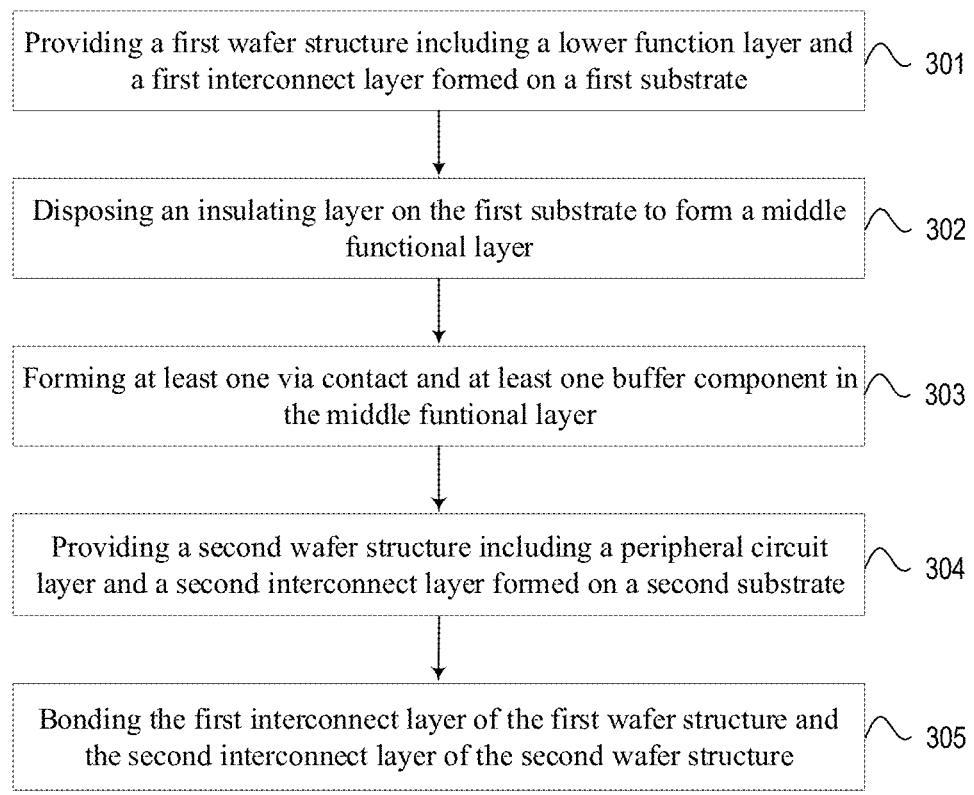
FIG. 3 illustrates a flow diagram of an exemplary method for forming a 3D memory device, according to some embodiments of the present disclosure.

FIG. 3 illustrates a flow diagram of an exemplary method for forming a 3D memory device, according to some embodiments of the present disclosure. As shown, the method can include the following operations.

In operation 301, a first wafer structure including a lower function layer and a first bonding layer formed on a first side of a first substrate can be provided. The first wafer structure can include a scribing region, a sealing region, and a chip region. The lower functional layer can be formed to include different structures in the scribing region, the sealing region, and the chip region, respectively. In the scribing region and the sealing region, the lower functional layer can include an insulating layer formed on the first side of the first substrate. In the sealing region, the lower functional layer can further include a second protection structure and at least one second contact formed in the insulating layer. In the chip region, the lower functional layer can include a dielectric/conductive stack formed on the first side of the first substrate, and an array of memory strings formed in the dielectric/conductive stack. The first bonding layer can be formed on the lower function layer, and can include a dielectric layer and multiple bonding pads embedded in the dielectric layer.

In operation 302, an insulating layer can be formed on a second side of the first substrate. The insulating layer and the first substrate can constitute a middle functional layer that is located adjacent to the lower functional layer.

In operation 303, at least one first contact and at least one buffer component can be formed in the middle functional layer in the sealing region. The at least one first contact can be embedded in at least a part of the middle functional layer and in electric contact with the second protection structure. The buffer component can be embedded in at least a part of the middle functional layer and in electric contact with the at least one second contact. The material of the embedded at least one buffer component can be different from the material of the middle functional layer.

In operation 304, a second wafer structure including a peripheral circuit layer and a second bonding layer formed on a second substrate can be provided. The peripheral circuit layer can include at least one peripheral circuit (e.g., peripheral circuit 210 as shown in FIGS. 1C and 2C) and can be formed on the second substrate (e.g., second substrate 202 as shown in FIGS. 1C and 2C). The second bonding layer can be formed on the peripheral circuit layer, and can include a dielectric layer and multiple bonding pads embedded in the dielectric layer.

In operation 305, the first bonding layer of the first wafer structure and the second bonding layer of the second wafer structure can be bonded with each other. For example, the first wafer structure (e.g., memory array wafer) can be firstly placed in an up-side-down manner, and then can be bonded to the second wafer structure (e.g., peripheral circuit wafer) in a face-to-face manner. The first bonding layer of the first wafer structure and the second bonding layer of the second wafer structure can be bonded using hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. The metal-metal bonding can be formed between bonding pads, and the dielectric-dielectric bonding can be formed between the dielectric layers.

According to some embodiments, in the disclosed fabricating method, at least one first contact and at least one buffer component (e.g., at least one second contact and/or insulating structure) can be formed in the middle functional layer. Therefore, most of the stress generated during the scribing process in the scribing region can be first absorbed by the first protection structure and the at least one first contact in the sealing region, and the unabsorbed small portion of the stress can pass through the gaps between the first contacts to the chip region and be absorbed by the buffer component. The two-stage stress absorption process can effectively reduce the defects in the chip region caused by the stress generated during the scribing process, thereby improving the production yield of the 3D memory device.

It is noted that, in the exemplary embodiments described above, the target scribing object is a bonding structure of two wafers. In some other embodiments, the similar design for the two-stage stress absorption can also be used in a single wafer structure.

It is noted that, in the fabricating method described above, there is no strict sequence between operation 301 and operation 302. That is, in some embodiments of the present disclosure, operation 301 can be performed before operation 302. In some other embodiments of the present disclosure, operation 301 can be performed after operation 302.

In the fabricating method described above, when providing the first wafer structure (operation 301), a material of the first substrate can include any suitable material such as Group III-V compounds including, but not limited to, monocrystalline silicon (Si), monocrystalline germanium (Ge), silicon germanium (GeSi), silicon carbide (SiC), silicon on insulator (SOI), germanium on insulator (GOI), gallium arsenide, etc.

In the fabricating method described above, when providing the second wafer structure (operation 302), a material of the second substrate can include any suitable material such as Group III-V compounds including, but not limited to, monocrystalline silicon (Si), monocrystalline germanium (Ge), silicon germanium (GeSi), silicon carbide (SiC), silicon on insulator (SOI), germanium on insulator (GOI), gallium arsenide, etc.

In the fabricating method described above, when bonding the first bonding layer of the first wafer structure and the second bonding layer of the second wafer structure (operation 305), one or more interconnect accesses can be used to as an interconnection bonding structure between the first wafer structure and the second wafer structure. As such, the first wafer structure (e.g., memory array wafer) and the second wafer structure (e.g., peripheral circuit wafer) can be bonded in a face-to-face manner and can be electrically connected with each other.

In the fabricating method described above, when forming a lower functional layer on the first substrate, a material of the lower functional layer can include oxide, such as silicon oxide.

Figure 4:
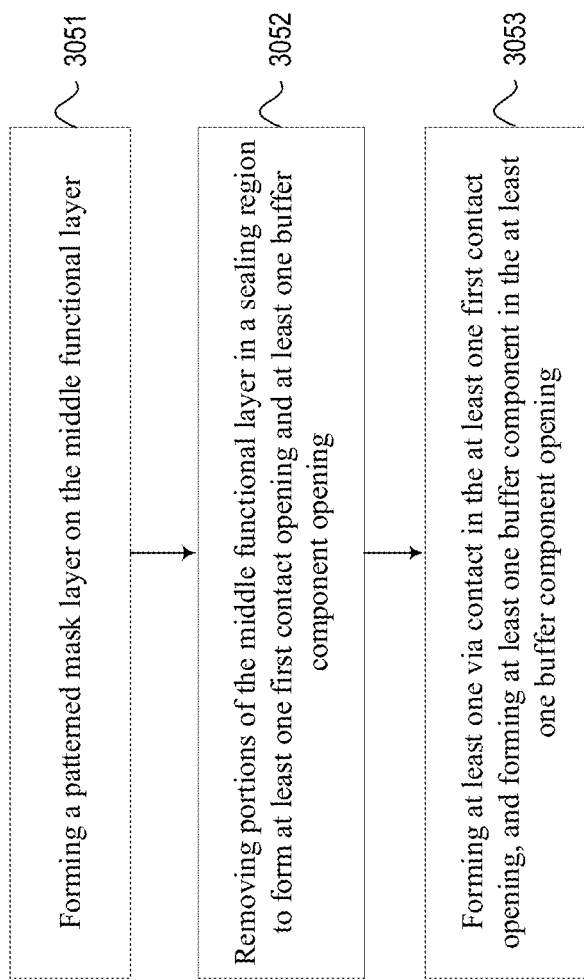
FIG. 4 illustrates a flow diagram of an exemplary method for forming a middle functional layer in a 3D memory device, according to some embodiments of the present disclosure.

FIG. 4 illustrates a flow diagram of an exemplary method for forming an insulating layer can be formed on the first substrate. The insulating layer and the first substrate can constitute a middle functional layer can located on the lower functional layer a middle functional layer in a 3D memory device, according to some embodiments of the present disclosure. As shown, operation 305 for forming at least one first contact and at least one buffer component in the middle functional layer can include the following operations.

In operation 3051, a patterned mask layer can be formed on the middle functional layer. As described above, the middle functional layer can include the first substrate as a first middle functional sub-layer, and the insulating layer as a second middle functional sub-layer.

In operation 3052, using the patterned mask layer, portions of the middle functional layer in the sealing region can be removed to form at least one first contact opening and at least one buffer component opening. The at least one first contact opening and at least one buffer component opening both penetrate the middle functional layer.

In operation 3053, at least one first contact can be formed in the at least one first contact opening, and at least one buffer component can be formed in the at least one buffer component opening.

It is noted that, the formed middle functional layer can have a double-layer structure or a multi-layer structure. In the embodiments described above in connection with FIG. 4, forming a double-layer middle functional layer is described as an example. The material of the first middle functional sub-layer (i.e., the first substrate 102a) can include silicon. The material of the second middle functional sub-layer (i.e., the insulating layer 102b) can include oxide, such as silicon oxide.

In the fabricating method described above, when patterning the first middle functional sub-layer and the second middle functional sub-layer to remove portions of the first middle functional sub-layer and the second middle functional sub-layer in the sealing region, the at least one buffer component opening can be formed on one side (e.g., inner side) of the at least one first contact opening that is close to the chip region and/or on another side (e.g., outer side) of the at least one first contact opening that is away from the chip region.

In the fabricating method described above, when patterning the first middle functional sub-layer and the second middle functional sub-layer to remove portions of the first middle functional sub-layer and the second middle functional sub-layer in the sealing region, the at least one buffer component opening can include at least one second contact opening and at least one insulating groove opening.

In some embodiments of the disclosed fabricating method, when the at least one buffer component is at least one second contact, operation 3053 for forming at least one first contact in the at least one first contact opening, and forming at least one buffer component in the at least one buffer component opening can include the following operations.

Firstly, an insulating material can be deposited to cover the sidewall and bottom of the at least one first contact opening and the at least one second contact opening.

Then, a portion of the insulating material at the bottom of the at least one first contact opening and the at least one second contact opening to expose top surfaces of at least one first protection structure and at least one second protection structure.

Next, a conductive material can be deposited to fill the at least one first contact opening and the at least one second contact opening to form at least one first contact and at least one second contact.

The through contact opening and the buffer through contact opening are filled with a conductive material to form the through contact and the buffer through contact.

In some other embodiments of the disclosed fabricating method, when the at least one buffer component is at least one insulating structure, operation 3053 for forming at least one first contact in the at least one first contact opening, and forming at least one buffer component in the at least one buffer component opening can include the following operations.

At first, an insulating material can be deposited to cover the sidewall and bottom of the at least one first contact opening and the at least one insulating structure opening.

Then, a portion of the insulating material at the bottom of the at least one first contact opening to expose top surfaces of at least one first protection structure.

Next, a conductive material can be deposited to fill the at least one first contact opening to form at least one first contact.

In the disclosed fabricating method described above in connection with FIG. 4, the insulating material can be the same as the material of the second middle functional sub-layer.

According to some embodiments of the disclosed fabricating method, the at least one second contact can be formed on one side (e.g., outer side) of the at least one first contact that is away from the chip region III. The stress generated during the scribing operation is first absorbed by the at least one second contact in the sealing region. The unabsorbed stress is transferred to the chip area III through the gap between the second contacts, and is absorbed by the first protection structure and the at least one first contact. As such, a two-stage stress absorption process can be achieved.

According to some embodiments of the disclosed fabricating method, one set of second contacts can be formed on one side (e.g., inner side) of the first contact that is close to the chip region III, and another set of second contacts can be formed on another side (e.g., outer side) of the first contacts that is away from the chip region III. The stress generated during the scribing operation first absorbed by the second contacts on the outer side and in the sealing region. One portion of the unabsorbed stress transferred through the gap between the second contacts to the chip area III can be absorbed by the first protection structure and the first contacts. The remaining portion of the unabsorbed stress transferred through the gap between the first contacts to the chip area III can be absorbed by the at least one buffer component on the inner side and in the sealing region. As such, a three-stage stress absorption process can be achieved to further reduce the defects in the chip region caused by the stress generated during the scribing process, thereby further improving the production yield of the 3D memory device.

It is also noted that, one or more though-buffer contacts can be formed on one side or both sides of the one or more first contacts. Based on the number of the second contacts, a multiple-stage stress absorption process can be realized.

In the fabricating method described above, when patterning the first middle functional sub-layer and the second middle functional sub-layer to remove portions of the first middle functional sub-layer and the second middle functional sub-layer in the sealing region, the formed one or more first contact openings and the formed one or more second contact openings can be arranged on staggered positions from each other.

As such, the formed one or more first contacts and the formed one or more second contacts can be arranged on staggered positions from each other. Thus, some portions of the unabsorbed stress transferred through the gap between the first contacts to the chip region can be absorbed by the second contacts, and some portions of the unabsorbed stress transferred through the gap between the second contacts to the chip region can be absorbed by the first contacts.

In some embodiments, when the formed one or more first contact openings and the formed one or more second contact openings are formed on staggered positions from each other, patterning the first middle functional sub-layer and the second middle functional sub-layer can include patterning the first middle functional sub-layer and the second middle functional sub-layer to remove portions of the first middle functional sub-layer and the second middle functional sub-layer in the sealing region to form multiple first contact openings and multiple second contact openings, while each second contact opening being located on the perpendicular bisector line of two adjacent first contact openings.

As such, each second contact can be formed on the perpendicular bisector line of two adjacent first contacts. Since the largest component of the stress transferred between adjacent first contacts to the chip region is distributed along the perpendicular bisector line of two adjacent first contacts, it can be the best position to form the second contact for absorbing the unabsorbed stress.

In the fabricating method described above, when the buffer component openings are second contact openings, operation 301 for forming a lower functional layer on the first substrate can include the following operations.

At first, a dielectric/conductive stack can be formed on the first substrate in the chip region, and an array of memory strings formed in the dielectric/conductive stack. An insulating layer can be formed on the dielectric/conductive stack in the in the chip region, and formed on the first substrate in the scribing region and the sealing region.

Then, the insulating layer can be patterned to remove portions of the insulating layer in the sealing region to form at least one first protection structure opening and at least one second protection structure opening.

Next, at least one first protection structure can be formed in the at least one first protection structure opening, and at least one second protection structure can be formed in the at least one second protection structure opening.

According to the fabricating method described above, when the at least one second contact is formed on the second protection structure, the combined structure of the at least one second contact and the second protection structure can absorb the transferred stress, thereby improving the stress absorption effect.

In some embodiments, after operation 303 for forming at least one first contact and at least one buffer component in the middle functional layer, the fabricating method can further comprises forming an upper functional layer on the middle functional layer. A material of the upper functional layer can include metal, such as aluminum. The upper functional layer can have different patterns in the scribing region I, the sealing region II, and the chip region III. In the scribing region I and the sealing region II, the upper functional layer may not be patterned. In the chip region III, the upper functional layer can have a predetermined pattern. Further, the upper functional layer can include multiple segments that are located in the scribing region I, the sealing region II, and the chip region III respectively, and are isolated from each other.

In some embodiments, after forming the upper functional layer on the middle functional layer, the fabricating method can further comprises forming an outer protective film 104 on the upper functional layer. A material of the outer protective film can include nitride, such as silicon nitride.

FIGS. 5A-5F illustrate schematic cross-sectional views of an exemplary 3D memory device at certain fabricating stages of the disclosed method according to some other embodiments of the present disclosure. It is noted that, the at least one second contact and the at least one insulating structure can be formed in a same process or in different processes.

Figure 5A:
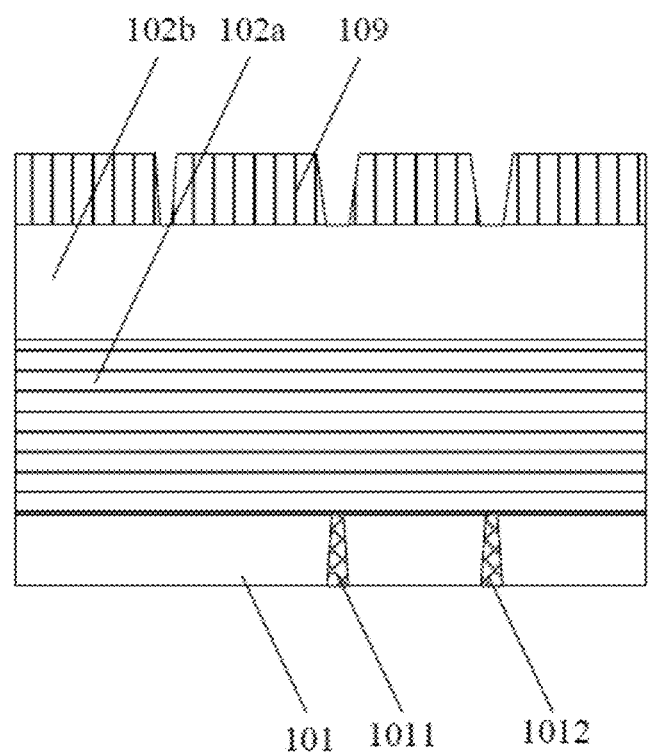
FIGS. 5A-5F illustrate schematic cross-sectional views of an exemplary 3D memory device at certain fabricating stages of the disclosed method according to some embodiments of the present disclosure.

As shown in FIG. 5A, a lower functional layer 101 formed on one side of a first substrate 102a can include at least one first protection structure 1011 and at least one second protection structure 1012 in a sealing region. An insulating layer 102b can be formed in another side of the first substrate 102a. The first substrate (also referred as the first middle functional sub-layer) 102a and the insulating layer (also referred as the second middle functional sub-layer) 102b can constitute the middle functional layer. A material of the first middle functional sub-layer 102a can include silicon. A material of the second middle functional layer sub-102b can include any suitable insulating material. In the memory manufacturing method of one embodiment of the present application, the material of the second sub-middle functional layer 102b is oxide, such as silicon oxide.

According to the fabricating method described above, the deposition process of the insulating layer 102b can be atomic layer deposition (ALD), physical vapor deposition (PVD), or chemical vapor deposition (CVD), etc.

After depositing the second middle functional sub-layer 102b, a photoresist layer 109 can be coated. The photoresist layer 109 can be exposed and developed to expose predetermined regions, which are used to form the at least one second contact opening and the at least one insulating groove opening.

Figure 5B:
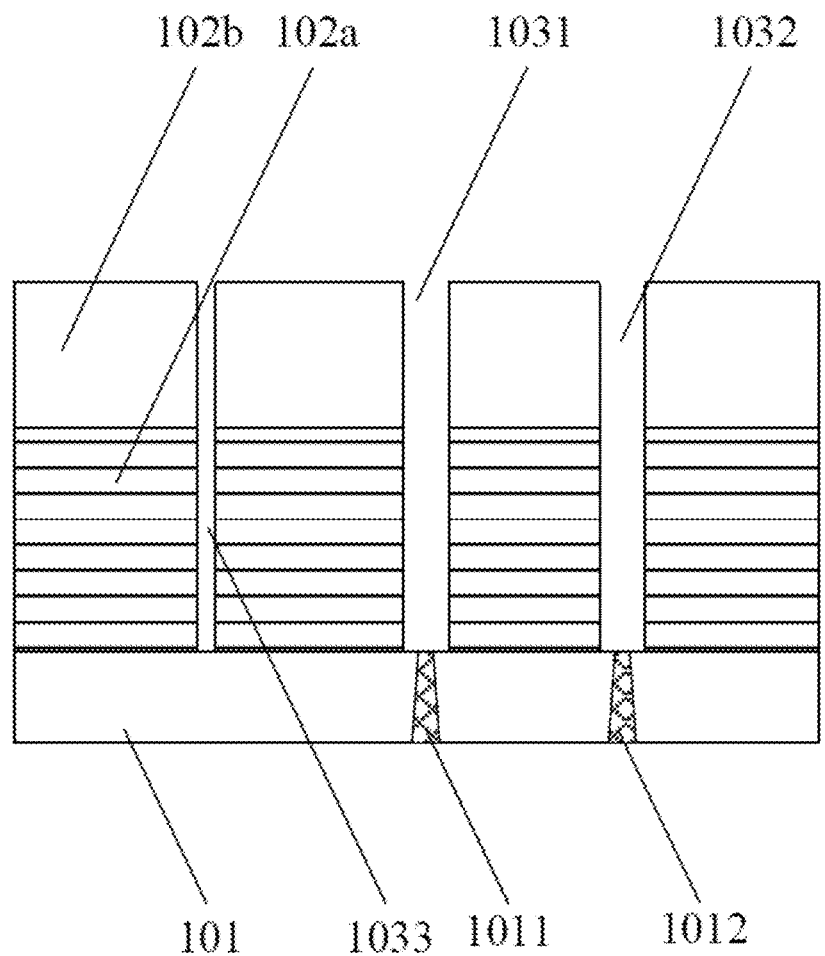

As shown in FIG. 5B, portions of the first middle functional sub-layer 102a and the second middle functional sub-layer 102b exposed through the photoresist layer 109 can be are sequentially removed by any suitable etching process, thereby exposing the structures of the lower functional layer 101. Specifically, the first protection structure 1011 can be exposed through the formed first contact opening 1031, the second protection structure 1012 can be exposed through the formed second contact opening 1032, and the lower functional layer 101 can be exposed in the formed insulating groove opening 1033.

The width of the insulating groove opening 1033 can be smaller than the width of the first contact opening 1031, and can be smaller than the width of the second contact opening 1032.

According to the fabricating method described above, the etching process can be an anisotropic etching process, such as dry etching, ion milling etching, plasma etching, reactive ion etching, laser etching, etc.

Figure 5C:
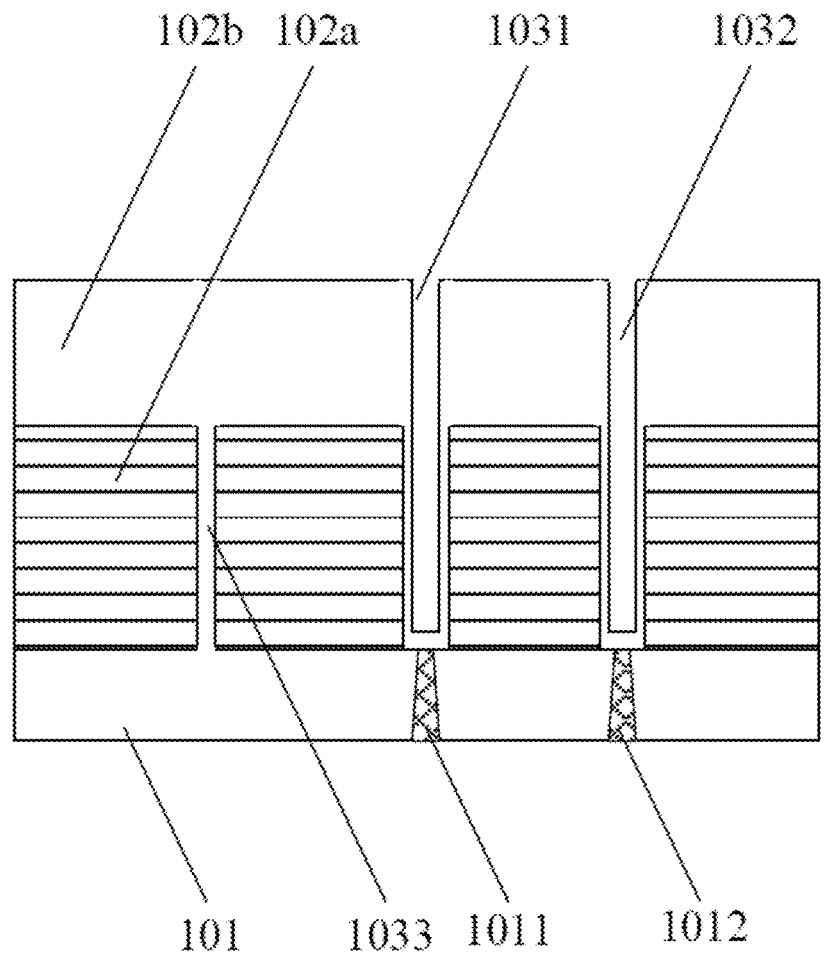

As shown in FIG. 5C, an insulating material is deposited in the first contact opening 1031, the second contact opening 1032, and the insulating groove opening 1033 by any suitable deposition process. The insulating material can be the same as the material of the second middle functional sub-layer 102b. In some embodiments, the insulating material can be silicon oxide.

Since the width of the insulating groove opening 1033 is smaller than the width of the first contact opening 1031, and is also smaller than the width of the second contact opening 1032, when the insulating material is filled the insulating groove opening 1033 to form an insulating structure 1023, an insulating layer (e.g., silicon oxide layer) can be formed on the sidewalls and the bottom surface of each first contact opening 1031 and second contact opening 1032.

Figure 5D:
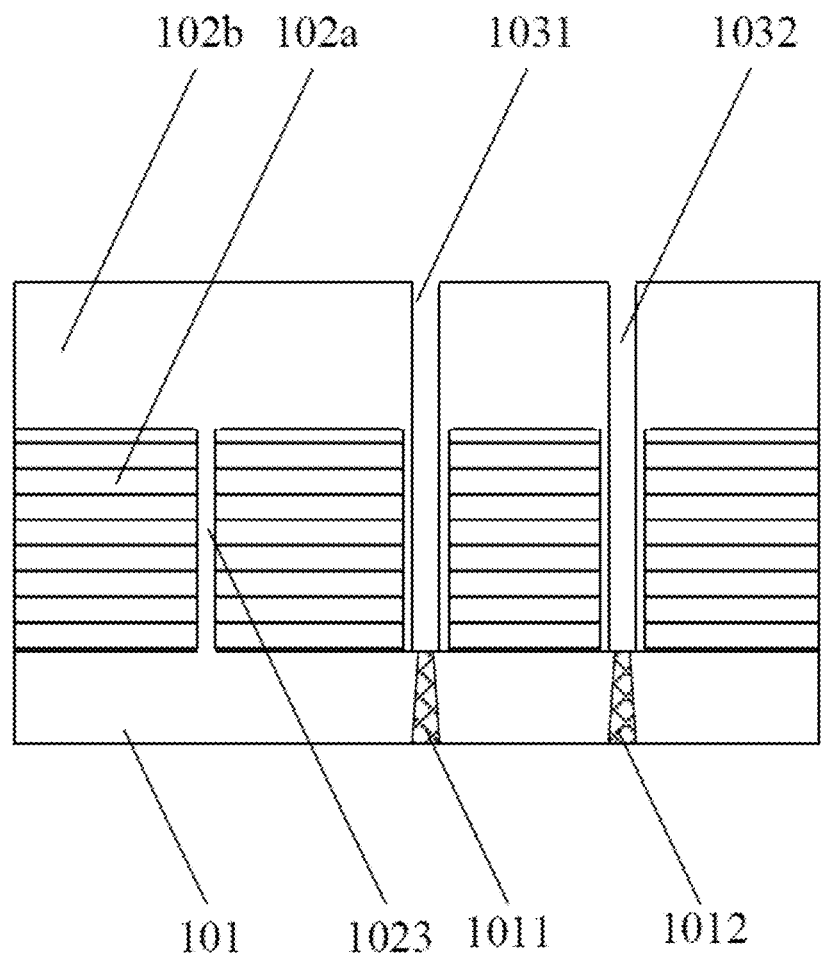

As shown in FIG. 5D, portions of the insulating layer (e.g., silicon oxide layer) at the bottom surface of each first contact opening 1031 and second contact opening 1032 can be removed by any suitable etching process, thereby exposing the corresponding first protection structure 1011 and the second protection structure 1012. The etching process can be a dry etching.

Figure 5E:
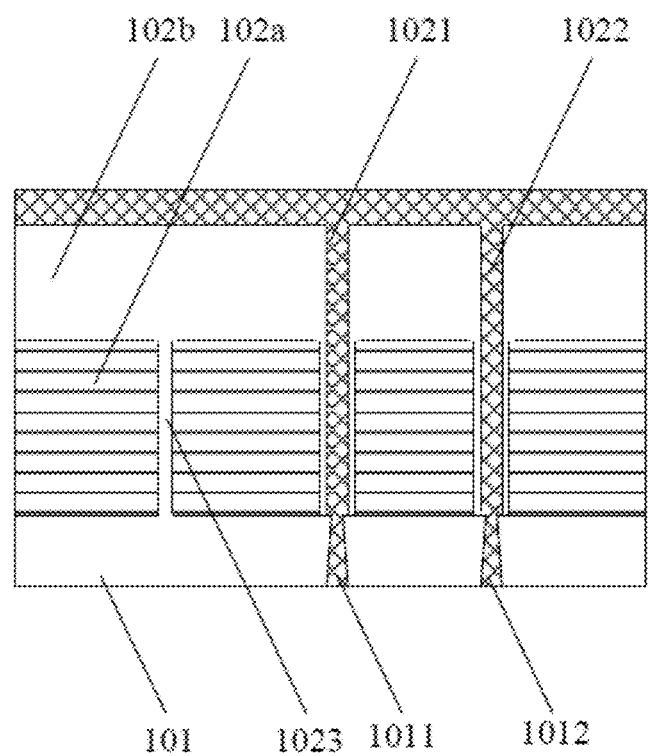

As shown in FIG. 5E, after exposing the first protection structure 1011 and the second protection structure 1012, a metal material can be deposited in each first contact opening 1031 and second contact opening 1032. In some embodiments, the metal material can be tungsten, while tungsten hexafluoride can be used as a tungsten source, and silane or diborane can be used as the redox compound.

Figure 5F:
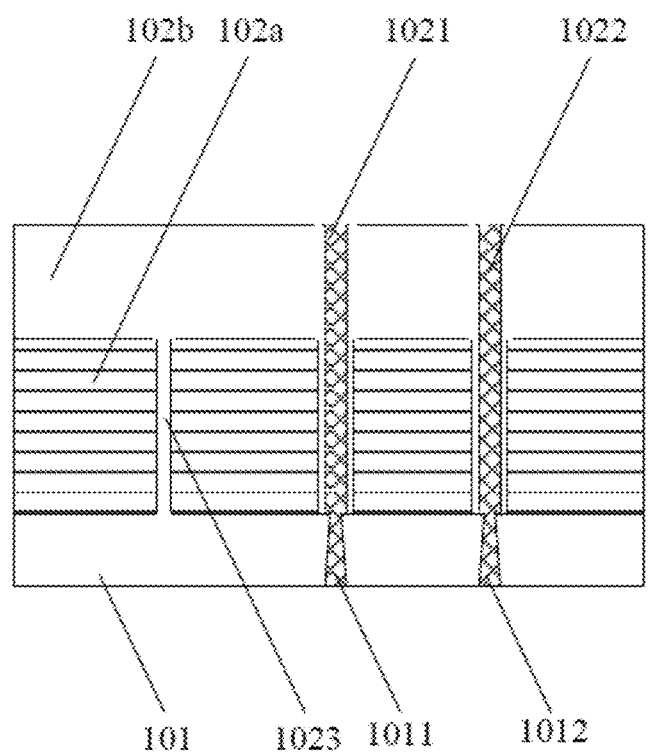

As shown in FIG. 5F, after depositing the metal material, portions of the metal material (e.g., tungsten) above the middle functional layer can be removed. The remaining portions of the metal material in each first contact opening 1031 and each second contact opening 1032 can form a first contact 1021 and a second contact opening 1022 respectively.

Accordingly, three-dimensional (3D) memory devices and fabricating methods thereof are disclosed.

In some embodiments, a disclosed memory device comprises a first wafer structure having a sealing region and a chip region. The first wafer structure comprises a substrate, a memory string array on a first side of the substrate in the chip region, a first protection structure and a second protection structure on the first side of the substrate in the sealing region, and a first contact and a second contact extending through the substrate in the sealing region. The first contact is in contact with the first protection structure, and the second contact is in contact with the second protection structure.

In some embodiments, the memory device further comprises an insulating structure extending through the substrate in the sealing region.

In some embodiments, the second contact is located on one side of the first contact and the insulating structure is located on another side of the first contact.

In some embodiments, the memory device further comprises a plurality of second contacts and a plurality of first contacts arranged in staggered positions from each other.

In some embodiments, the memory device further comprises an insulating layer on a second side of the substrate.

In some embodiments, the substrate comprising a semiconductor material, and the insulating layer comprising an oxide material.

In some embodiments, the first contact and the second contact penetrate the substrate and the insulating layer.

In some embodiments, the memory device further comprises a conductive layer disposed on the insulating layer.

In some embodiments, the first contact and the second contact are electrically connected to the conductive layer.

In some embodiments, the first wafer structure further comprises a first bonding layer disposed on the memory string array, the first protection structure, and the second protection structure. The memory device further comprises a second wafer structure including a second bonding layer disposed on a periphery circuit layer. The first bonding layer of the first wafer structure is bonded with the second bonding layer of the second wafer structure.

Another aspect of the present disclosure provides a method for forming a memory device, comprising: forming a substrate; forming a memory string array on a first side of the substrate in a chip region; forming a first protection structure and a second protection structure on the first side of the substrate in a sealing region; forming an insulating layer on a second side of the substrate; and forming a first contact and a second contact extending through the substrate in the sealing region; wherein the first contact is in contact with the first protection structure, and the second contact is in contact with the second protection structure.

In some embodiments, forming the first protection structure and the second protection structure comprises: forming the first protection structure to enclose the memory string array in a horizontal direction; and forming the second protection structure to enclose the memory string array in the horizontal direction.

In some embodiments, forming the first contact and the second contact comprises: forming a patterned mask layer on the insulating layer; removing portions of the insulating layer and the substrate in the sealing region to form the a first contact opening and a second contact opening in the insulating layer and the substrate; and forming the first contact in the first contact opening, and forming the second contact in the second contact opening.

In some embodiments, the method further comprises forming an insulating structure extending through the substrate in the sealing region.

In some embodiments, the substrate is formed by a semiconductor material, and the insulating layer is formed by an oxide material.

In some embodiments, the second contact is formed on one side of the first contact and the insulating structure is formed on another side of the first contact.

In some embodiments, forming the first contact and the second contact comprises: forming a plurality of first contacts; and forming a plurality of second contacts; wherein the plurality of second contacts and the plurality of second contacts are arranged in staggered positions from each other.

In some embodiments, the method further comprises forming a conductive layer on the insulating layer.

In some embodiments, the conductive layer is formed electrically connected to the first contact and the second contact.

In some embodiments, the method further comprises forming a first bonding layer on the memory string array, the first protection structure, and the second protection structure; and bonding a wafer structure to the first bonding layer.

In some embodiments, the wafer structure comprises an second bonding layer disposed on a periphery circuit layer.

Other aspects of the present disclosure can be understood by those skilled in the art in light of the description, the claims, and the drawings of the present disclosure.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
 a wafer structure having a sealing region and a chip region, comprising:
  a substrate;
  a memory string array over a first side of the substrate in the chip region;
  a first protection structure and a second protection structure on the first side of the substrate in the sealing region;
  a first contact and a second contact extending through the substrate in the sealing region,
 wherein the first contact is in contact with the first protection structure, and the second contact is in contact with the second protection structure; and
  an insulating structure extending through the substrate in the sealing region.

2. The memory device of claim 1, wherein the second contact is located on one side of the first contact and the insulating structure is located on another side of the first contact.

3. The memory device of claim 1, further comprising:
 a plurality of second contacts and a plurality of first contacts arranged in staggered positions from each other.

4. The memory device of claim 1, further comprising an insulating layer over a second side of the substrate.

5. The memory device of claim 4, wherein:
 the substrate comprises a semiconductor material; and
 the insulating layer comprises an oxide material.

6. The memory device of claim 4, wherein:
 the first contact and the second contact penetrate the substrate and the insulating layer.

7. The memory device of claim 4, further comprising a conductive layer disposed over the insulating layer.

8. The memory device of claim 7, wherein the first contact and the second contact are electrically connected to the conductive layer.

9. The memory device of claim 1, wherein:
the wafer structure further comprises a first bonding layer disposed over the memory string array, the first protection structure, and the second protection structure;
the memory device further comprises another wafer structure including a second bonding layer disposed on a periphery circuit; and
the first bonding layer of the wafer structure is bonded with the second bonding layer of the another wafer structure.

10. A method for forming a memory device, comprising:
forming a substrate;
forming a memory string array on a first side of the substrate in a chip region;
forming a first protection structure and a second protection structure on the first side of the substrate in a sealing region;
forming an insulating layer on a second side of the substrate; and
forming a first contact and a second contact extending through the substrate in the sealing region,
wherein the first contact is in contact with the first protection structure, and the second contact is in contact with the second protection structure; and
forming an insulating structure extending through the substrate in the sealing region.

11. The method of claim 10, wherein forming the first protection structure and the second protection structure comprises:
forming the first protection structure to enclose the memory string array in a horizontal direction; and
forming the second protection structure to enclose the memory string array in the horizontal direction.

12. The method of claim 10, wherein forming the first contact and the second contact comprises:
forming a patterned mask layer on the insulating layer;
removing portions of the insulating layer and the substrate in the sealing region to form a first contact opening and a second contact opening in the insulating layer and the substrate; and
forming the first contact in the first contact opening, and forming the second contact in the second contact opening.

13. The method of claim 10, wherein:
the substrate is formed by a semiconductor material; and
the insulating layer is formed by an oxide material.

14. The method of claim 10, wherein the second contact is formed on one side of the first contact and the insulating structure is formed on another side of the first contact.

15. The method of claim 10, wherein forming the first contact and the second contact comprises:
forming a plurality of first contacts; and
forming a plurality of second contacts;
wherein the plurality of first contacts and the plurality of second contacts are arranged in staggered positions from each other.

16. The method of claim 10, further comprising:
forming a conductive layer on the insulating layer.

17. The method of claim 16, wherein the conductive layer is electrically connected to the first contact and the second contact.

18. The method of claim 10, further comprising:
forming a first bonding layer on the memory string array, the first protection structure, and the second protection structure; and
bonding a wafer structure to the first bonding layer, wherein the wafer structure comprises a second bonding layer disposed on a periphery circuit.

* * * * *